United States Patent [19]

Cronin

[11] Patent Number: 4,698,284
[45] Date of Patent: Oct. 6, 1987

[54] DEVICE FOR ALIGNING A PHOTOMASK ONTO A PRINTED WIRING BOARD

[75] Inventor: John V. Cronin, Newport Beach, Calif.

[73] Assignee: M&T Chemicals Inc., Woodbridge, N.J.

[21] Appl. No.: 791,256

[22] Filed: Oct. 25, 1985

[51] Int. Cl.⁴ ............... G03F 9/00; H01M 8/10; G03B 21/22
[52] U.S. Cl. ............................ 430/5; 430/30; 430/311; 430/325; 355/78; 355/86; 355/100
[58] Field of Search ............. 430/5, 30, 311, 325, 430/327; 355/78, 86, 100

[56] References Cited

U.S. PATENT DOCUMENTS

| | | |
|---|---|---|
| 3,865,254 | 2/1975 | Johannsmeier ............... 214/1 BH |
| 3,940,211 | 2/1976 | Johannsmeier ............... 355/53 |
| 4,508,802 | 4/1985 | Heiart et al. ............... 430/22 |
| 4,518,667 | 5/1985 | Heiart et al. ............... 430/22 |
| 4,522,903 | 6/1985 | Heiart et al. ............... 430/22 |
| 4,527,890 | 7/1985 | Heiart et al. ............... 355/100 |
| 4,548,884 | 10/1985 | Heiart ............... 430/22 |

Primary Examiner—John E. Kittle
Assistant Examiner—Patrick J. Ryan
Attorney, Agent, or Firm—S. H. Parker; J. Matalon; R. Bright

[57] ABSTRACT

An apparatus for applying a phototool to a light sensitive substrate by means of a roller for applying the phototool to the substrate and a vacuum restraining means for restraining the phototool to maintain it under tension during application of the phototool to the substrate.

9 Claims, 8 Drawing Figures

DEVICE FOR ALIGNING A PHOTOMASK ONTO A PRINTED WIRING BOARD

FIELD OF THE INVENTION

This invention relates to an apparatus and improved method for applying a photomask onto a printed wiring board.

BACKGROUND OF THE INVENTION

It is often necessary to expose an image from a transparency onto a light sensitive receiving element. Such receiving element can be a printed wiring board, a conducting foil, elements used in etching, etc. In practice, such light sensitive receiving elements are brought into contact with the image bearing transparency in a printing frame or similar device and are exposed to a special light source. Printed wiring boards are usually pre-worked with an arrangement of drilled holes. However, difficulty arises in assuring good registration, i.e., an accurate fit, between the transparency and the board, especially when several boards are consecutively exposed.

To assure good registration between the transparency and the printed wiring board (hereinafter referred to as PWB), the practice has been to visually align the transparency (commonly referred to in the trade as photomask or phototool) with the PWB and secure it to the PWB with adhesive tape. This method, however, is not very accurate because it is somewhat dependent upon an operator's skill to perfectly align the phototool and PWB. Furthermore, this method is cumbersome, and its productivity is low.

In an effort to eliminate the drawbacks of such method, pins have been used through a prearrangement of holes in the phototool and PWB to align both together. At least in principle, the desired reproducibility of alignment, when several PWBs are to be exposed, can be obtained with the use of alignment pins, provided, of course, that the alignment holes are accurately located in both the PWB and the phototool to assure correct registration of the pattern to be reproduced. However, once punched, the phototool can no longer be adjusted relative to the PWB, and, therefore, any misalignment between the PWB and the phototool, usually caused by inaccurate punching of holes or by manufacturing tolerances, cannot be corrected. This disadvantage results in a high number of rejections or increased refinishing operations.

In addition to problems of alignment of the photomask, care must be taken that the mask is not stretched or marked by the means used to apply the mask to the printed circuit board.

Computer grade PC boards are typically manufactured in panel form in sizes of the order of 18 by 20 inches (0.46 M by 0.5 M). Conductor lines and spaces are of the order of 0.010 inch wide (0.025 cm) with sharply defined edges, free of nicks and bulges. Additionally, the imaging resist forming the conductors must be maintained at a constant thickness, consistent with plating or etching chemicals, temperature and immersion time. Too thin a resist results in breakdowns and plating of metal at unwanted locations.

With regard to image placement on the copper-clad board, the 18 by 20 inches (0.46 M by 0.5 M) panel will typically have an accuracy of 0.002 inch (0.05 mm) on drilled hole locations, requiring that the imaging be accurate to within 0.005 inch (0.13 mm) in order to maintain an annular ring of the order of 0.005 inch (0.13 mm) around the hole.

The UV curable photopolymers used in PWB manufacture have been developed for application by screen printing over a copper surface and cured by conveying under mercury vapor lamps. Surface temperature rise is significant, because the board receives approximately 200 watt-seconds of energy per square inch of area for polymer whose surface is exposed to air. Typically, surface temperatures in excess of 300 degrees F. are experienced. However, most of the tested photopolymers are affected by air to the extent that the exposure energy can be reduced to only 50 watt-seconds per square inch when the air is completely excluded by the mating process of the present invention.

In one method for producing graphic images on substrates, photopolymers, characterized by a composition of 100 percent reactive polymers having a paste-like consistency, are transformed from a paste-consistency wet film to a dry coating by exposure to a strong ultraviolet (UV) light source for a predetermined period of time. These photopolymers are further characterized as being imaging quality, or capable of being selectively hardened by light passing through a photographic master, thereby capable of being transformed into a film securely affixed to a substrate at locations where the photographic master allowed the UV light to impinge upon the photopolymer. For example, these photopolymers are available commercially as plating resists and as etch resists for use in the manufacture of PWBs, and also for graphics imaging. Such photopolymers can be applied conventionally by screen printing the wet photopolymer through an image bearing screen stencil to deposit images on the substrates which are then hardened and transformed into permanent images by being subjected to a strong UV light source.

Such screen printed photopolymer images are characterized by large energy expenditure, heated substrates, indistinct boundaries, loss of fidelity, and smeared images.

The images which can be achieved using the disclosed process and apparatus and the same photopolymers are characterized by lines having sharp, distinct boundaries, and exceptional fidelity with film thicknesses up to 0.002 inch (0.05 mm) without any smearing. For example, conventional screen printed PWB resist patterns are practically limited to conductor widths and spacing of 0.010 inch (2.54 mm) minimum, while the same photopolymers can be imaged as disclosed herein to produce line widths and spacing of 0.003 inch (0.076 mm), with a film thickness of 0.00025 inch (0.006 mm). Conventional screen printed half-tone images are limited to a practical upper range of 105 lines, with dot sizes of 20 to 80 percent. The same photopolymer imaged as described herein can be transformed into halftone graphics of 150 lines, with dot sizes of 5 to 95 percent.

Conventional preparation of photopolymer relief printing plates are described in U.S. Pat. No. 4,070,110, issued Jan. 24, 1978, and in U.S. Pat. No. 4,087,182, issued May 2, 1978. These are contact printing processes as compared to a photo imaging process such as described in U.S. Pat. No. 4,052,603, issued Oct. 4, 1977. All of these involve complex and expensive machinery and could not result in simple single pass lamination and exposure scanning as can the present invention.

U.S. Pat. No. 4,159,176, issued June 26, 1979, discloses a device for aligning a photomask onto a printed circuit board. An exposure frame is used to align and hold the photomask in registration with a printed circuit board which has been coated with a photosensitive material.

U.S. Pat. No. 3,948,657, issued Apr. 6, 1976, discloses a method for adhering a photoconductive layer to an insulating layer, using an adhesive. The insulating layer is brought into contact with the adhesive coated photoconductive layer by means of a squeegee, which can be a roller or blade, for example, a coating knife.

U.S. Pat. No. 4,506,004, issued Mar. 19, 1985, discloses a method for preparing a printed wiring board. A photopolymer is brought into contact with a liquid polymer layer to mate with the printed wiring board by using a knife blade.

U.S. Pat. No. 4,424,089, issued Jan. 3, 1984, discloses a process for applying a paste-consistency photopolymer to a printed wiring board. Photographic film is brought into intimate contact with the photopolymer using a resilient blade.

U.S. Pat. No. 4,260,675, issued Apr. 7, 1981, discloses a method for preparing a printed circuit board solder mask. The exposure assembly, comprised of a coated PWB between two exposure plates, is connected to a vacuum source and is evacuated so that atmospheric pressure holds the plates and PWB together while the assembly is conveyed under a UV lamp.

U.S. Pat. No. 3,837,887, issued Sept. 24, 1974, discloses a process for the preparation of printing plates of photo-sensitive resin. A method is disclosed for applying a sheet smoothly over a doctored surface of photosensitive resin by using a roller to advance the film and smoothly apply it to the photosensitive resin. In one embodiment, the film is applied using the roller and a separate idler roller which urges the sheet against the roller.

U.S. Pat. No. 4,528,261, issued July 9, 1985, discloses another application of a pressure roller to form a laminate having a photohardenable liquid layer.

The present invention provides a simplified and improved process and apparatus over prior art equipment and processes for producing printed elements of high resolution with liquid photopolymers,

SUMMARY OF THE INVENTION

One feature of the present invention is an improved apparatus for applying a flexible phototool to a light sensitive receiving element comprising: a housing; means for supporting the light sensitive receiving element in the housing; hinged registering and securing means for the flexible phototool; means for applying the flexible phototool to the light sensitive receiving element; and means for maintaining the flexible phototool under tension while it is being applied to the light sensitive receiving element.

Another feature of the present invention is an improved process for applying a flexible phototool to a light sensitive receiving element comprising the following steps: positioning the phototool in alignment with and off contact from the light sensitive receiving element; applying the flexible phototool to the light sensitive receiving element by means of a roller; restraining the flexible phototool during the roller application by vacuum restraining means against which the flexible phototool is slideably secured by suction, thereby maintaining the flexible phototool in tension during said application.

By placing the phototransparency image directly in contact with the liquid photopolymer, the described process and apparatus are capable of providing increased image resolution with a film thickness of between 0.25 thousandth of an inch (0.006 mm) and over 2 thousandths of an inch (0.05 mm).

While it is possible to image the coated PWB with the phototool off-contact from each other, it is not cost-effective, since an expensive collimated light source is required; other light sources will produce light undercutting, reduced line widths, and loss of line fidelity. In order to use a non-collimated light source and still achieve fine line imaging, it is necessary for the phototool image bearing surface to intimately contact the photopolymer, as is accomplished herein.

In addition, excluding air from the liquid photopolymer during the photo exposure step by sandwiching the polymer between two layers, one of which carrying a phototransparency image, exposure time is decreased, energy is decreased, speed of production is increased, temperature effect is decreased and resolution is improved.

Preferably, the photopolymers are applied as a layer in a wet state and converted to a hardened polymerized image state by exposure to light through specially formulated phototransparencies. One objective, then, is to provide a significantly improved image resolution over known competing imaging processes.

Another objective is to provide phototransparency techniques interrelating with liquid photopolymers to greatly reduce the total cost of image formation by use of less expensive equipment and photopolymer, to provide improved image resolution and to increase productivity.

Still another objective of this invention is to produce substrates using screen printing techniques and to expose the photopolymer by phototransparency imaging techniques in which the inherent limitations of screened printing are overcome, including Moire patterns in half-tone images and limited resolution of line images.

These and other objectives and advantages of the present invention will be more fully understood from the following detailed description of a preferred embodiment of the invention, especially when that description is read in conjunction with the accompanying drawings.

DESCRIPTION OF THE PREFERRED EMBODIMENT

Figure 1:
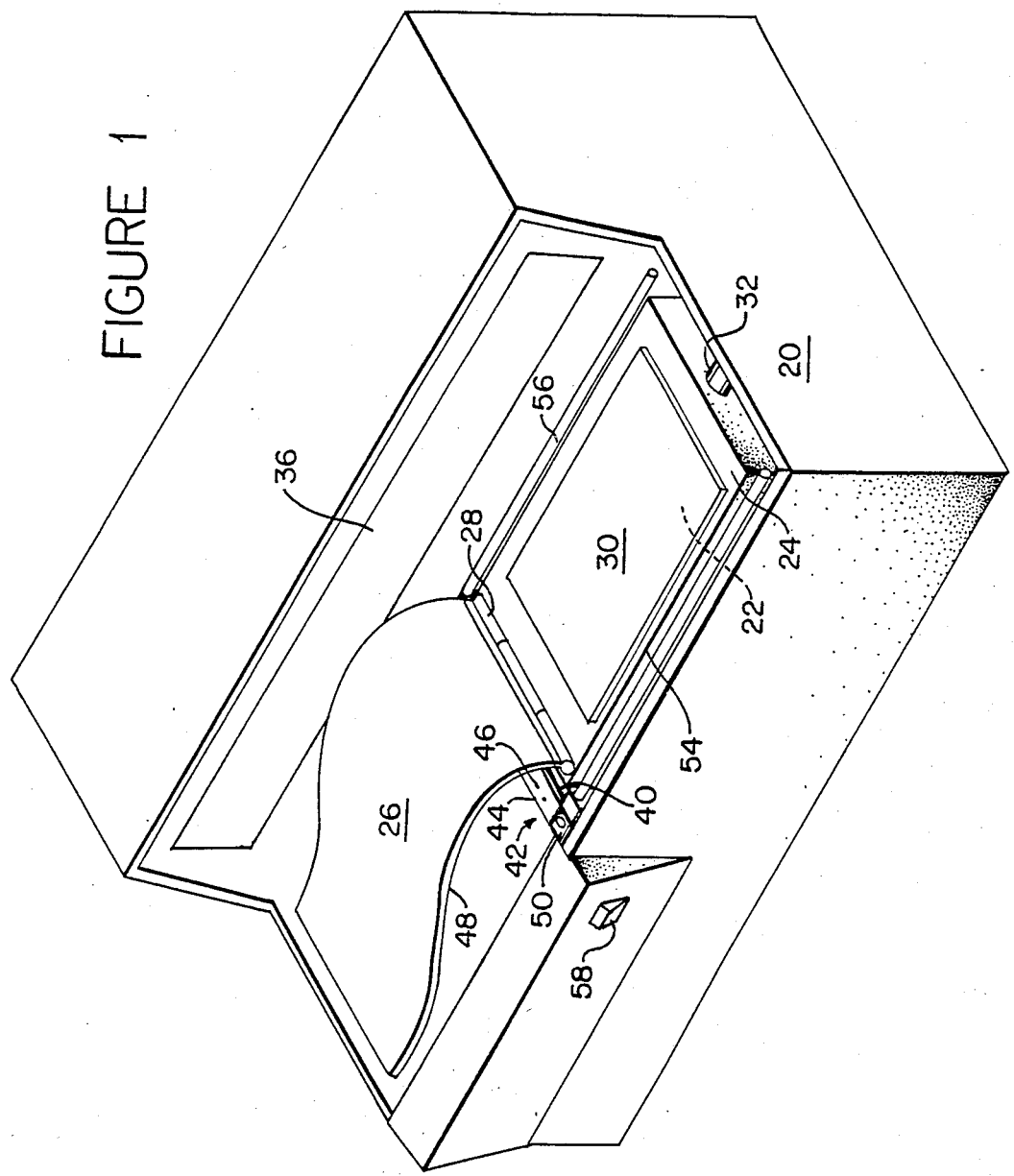
FIG. 1 is a perspective view of the apparatus of this invention.

A phototool, as used herein, is a transparent sheet with light opaque areas, corresponding to the image to be reproduced, which is placed between the UV lamp and the substrate to control those areas of photopolymer to be hardened. The terms photoimage, photomask and phototool can be used interchangeably.

To make a phototool, a sheet of clear polyester and a thin sheet of aluminum foil are laminated together with a thin layer of clear silicone rubber adhesive bonding the two securely. The foil is given a pre-etch in sodium hydroxide to reduce the foil thickness to about 0.0001 inch (0.0025 mm). The foil is then coated with a photographic etch resist. Later, it is exposed and washed, and then it is etched again to produce the phototool image in etched foil.

Etched aluminum foil is preferred over other black emulsion systems because black emulsion would absorb larger quantities of heat that can distort the phototool, while the aluminum surface reflects heat and thus reduces the total amount of heat absorbed.

The flexible, polyester phototool is coated over its foil surface with silicone rubber adhesive, such as Dow Corning product code 734 RTV, for two reasons. First, the resilient rubber can accommodate PWB surface irregularities, for example, small dirt particles that may be on the PWB surface. During the mating cycle, these irregularities can cause a separation to exist between phototool and PWB which will mar the image over a much wider area than the irregularity itself. The silicone rubber, being resilient, conforms to the irregularity and reduces the marred area. Second, the silicone rubber adhesive forms a non-stick surface on the phototool to which the hardened photopolymer will not adhere.

The phototool can also be made of polyester photographic film having either a silver halide emulsion or a diazo emulsion, with a suitable non-stick surface added.

Methods for mating phototools to printed wiring boards are well known in the art as disclosed, for example, in U.S. Pat. Nos. 4,260,675; 4,424,089; and 4,506,004 incorporated herein by reference above. The following description illustrates this mating technique.

Typically, a phototool is mated to the PWB, which includes a substrate with a copper coating, that has been roughly coated with a photopolymer. The phototool is positioned above, and off contact with, the PWB so that the opaque areas are registered with predrilled holes in the PWB. The top surface of the phototool is traversed by a rubber blade, such as a squeegee, or roller of about 50 durometer hardness to urge the phototool into intimate contact with the photopolymer coated PWB. This technique purges the phototool of air bubbles which may have been entrapped during the coating cycle, and also prevents the entrapment of air resident between the phototool and photopolymer surface. After the phototool has been brought into intimate contact with the PWB, the composite is exposed to actinic light. In areas covered by the opaque areas, the polymer remains uncured. It can be washed away and the exposed areas etched away leaving behind the desired wiring circuit on the PWB.

Such mating technique has several highly desirable features not readily obtainable otherwise. First, the photopolymer surface, when coated, may be mottled or it may have an orange-peel effect. These surface irregularities are smoothed out so that the mated surface conforms to the smooth plastic surface topology of the phototool as well as to the substrate, which carries a copper layer surface that is to be conformed to the image of the phototool.

On those areas of the phototool now mated with the photopolymer, a strong holding force is maintained between the phototool and PWB surface. Atmospheric pressure maintains the phototool in intimate contact with the photopolymer surface indefinitely, without the aid of an outside vacuum source. Phototool opaque areas (which usually do not constitute surface irregularities) are in intimate contact with the photopolymer surface, and the photopolymer can be exposed with a non-collimated light source to produce high fidelity reproduction of the phototool images onto the PWB plating resist pattern.

Preferably, photopolymer is cured by means of UV lamps. For this purpose, a UV lamp and reflector-focuser are mounted on the same movable transversing assembly. After the phototool is mated with the photopolymer, light rays from the UV lamp expose and polymerize the photopolymer layer directly beneath the phototool transparent areas. The preferred liquid photopolymer is product number 1075 UV curable photopolymer available from the M&T Chemicals Inc. at Rahway, N.J. This is a negative acting polymer capable of hardening in light struck areas and remaining liquid in opaque image marked unexposed areas. The unexposed liquid photopolymer can be washed out in a 50% solution of isopropyl alcohol and tri-chloroethane.

Referring now to the drawings, FIG. 1 shows the apparatus of this invention which includes a light box housing 20, a support plate 22, a support plate frame 24 and a phototool 26. The phototool 26 is restrained at one end thereof by a hinge 28 and is adapted to be held in registration with a PWB 30. The support assembly (22 and 24) is rotatably mounted so as to pivot about shaft 32.

The support plate 22 can have holes or slots (not shown) through which vacuum can be applied to the underside of the PWB 30 to hold it securely in place against the support plate 22 during exposure, the polymer curing step. A vacuum source can be connected to the support assembly (22 and 24) through the shaft 32.

Although the hinge 28 can be permanently attached to the support plate frame 24, preferably, it is mounted thereto by means of screws and screw slots (both not shown) in a conventional manner so that screw slots (not shown) in the support plate frame 24 lay at right angles to screw slots in the hinge 28. In this way, the hinge 28 can be moved in two directions to permit accurate alignment or registration of the phototool 26 with the PWB 30 on the support plate 22.

Phototool 26 and PWB 30 are coated with photosensitive polymer 34 by screen printing to the desired thickness. A coating assembly can be mounted in a compartment 36 of the light box housing 20, and it can be comprised of a container for photopolymer, an outlet port and metering means to control the flow rate of photopolymer, and a doctor blade positioned behind the photopolymer outlet. The coating assembly can be mounted on its own traverse rod, extending across the length of the compartment 36. When the phototool 26 and PWB 30 have been properly positioned in place, the coating assembly circuit is energized. The compartment door rolls up and inward and the coating assembly moves out over the phototool and PWB. As the assembly moves along the phototool and/or PWB, photopolymer is metered onto either one or both of them and is smoothed out by the following doctor blade. At the end of the coating cycle a limit switch is activated to return the coating assembly back along its traverse rod and into the compartment 36.

The photosensitive polymer can be partially cured, if desired, by pre-exposure to actinic light before the phototool is placed in registration with the PWB. Optionally, the phototool need not be coated with the photosensitive polymer.

In prior art methods of registering a phototool onto a PWB, a doctor knife or roller would be used to urge the unrestrained phototool against the photopolymer coated PWB. This resulted in air entrapment, as well as wrinkling and stretching of the phototool, causing the phototool to be out of registration with the PWB. Furthermore, the phototool is easily scratched by the doctor knife. In some cases all of these faults could occur together.

To avoid these disadvantages of prior art application techniques, the phototool 26 is applied to the PWB 30 by use of a roller 40 while simultaneously tensioning the phototool 26 with a restraining means 42 adjacent the roller 40. Presently, it is contemplated that the restraining means 42 is comprised of a hollowed chamber 44 with ports 46 to permit evacuation of air within the chamber 44 for the purpose of exerting a suction force upon an outside surface 48 of the phototool 26 to urge the phototool 26 against the restraining means 42. At least one surface of the restraining means 42 is maintained in sliding contact with the phototool 26, preferably along a smooth curve, to minimize scratching the phototool 26 and to ensure uniform suction force to overcome natural tension (bowing) in the flexible phototool.

Figure 2:
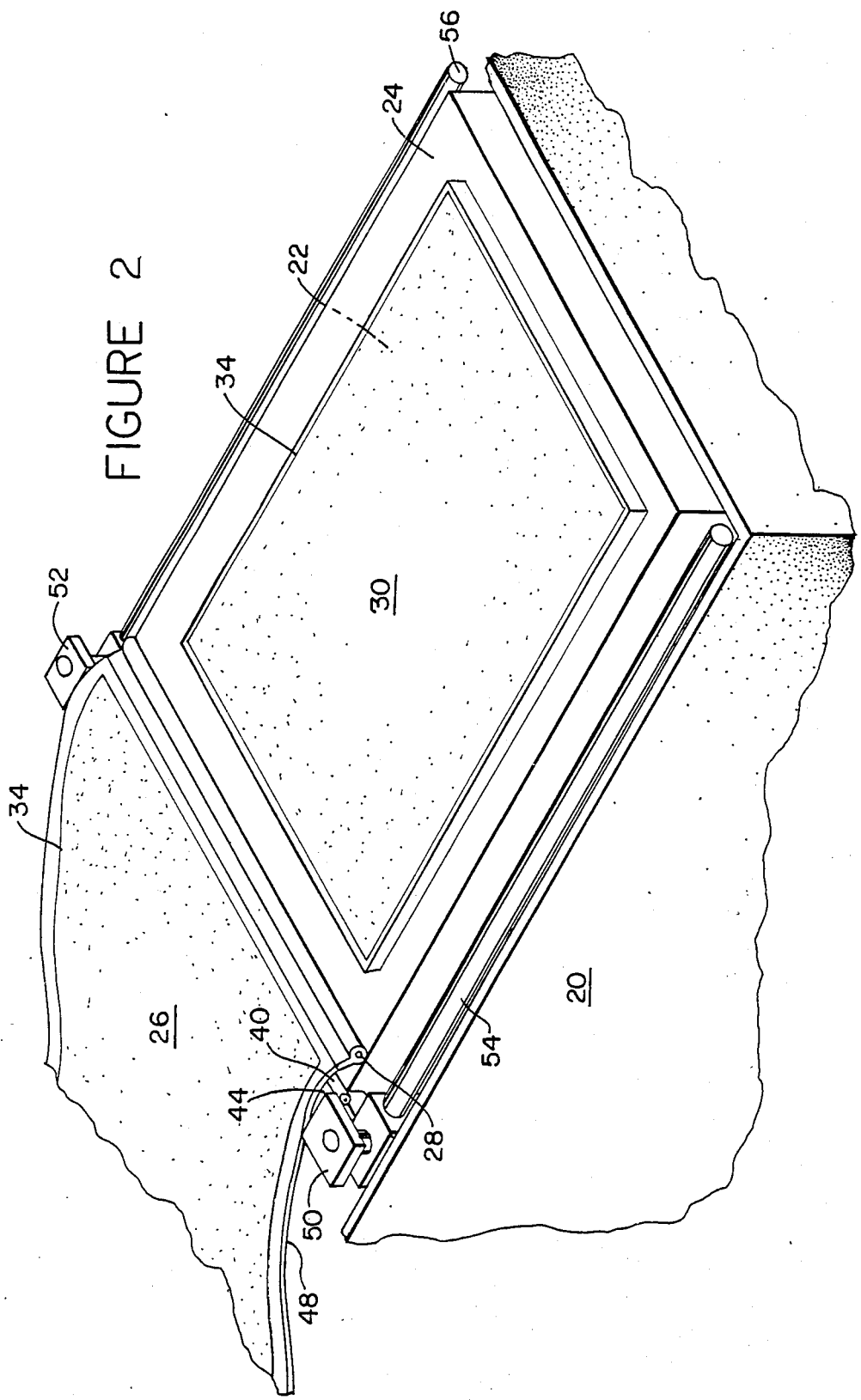
FIG. 2 is an enlarged, fragmentary view in perspective of the apparatus of FIG. 1 showing the vacuum hold down and roller in a raised condition.
Figure 3:
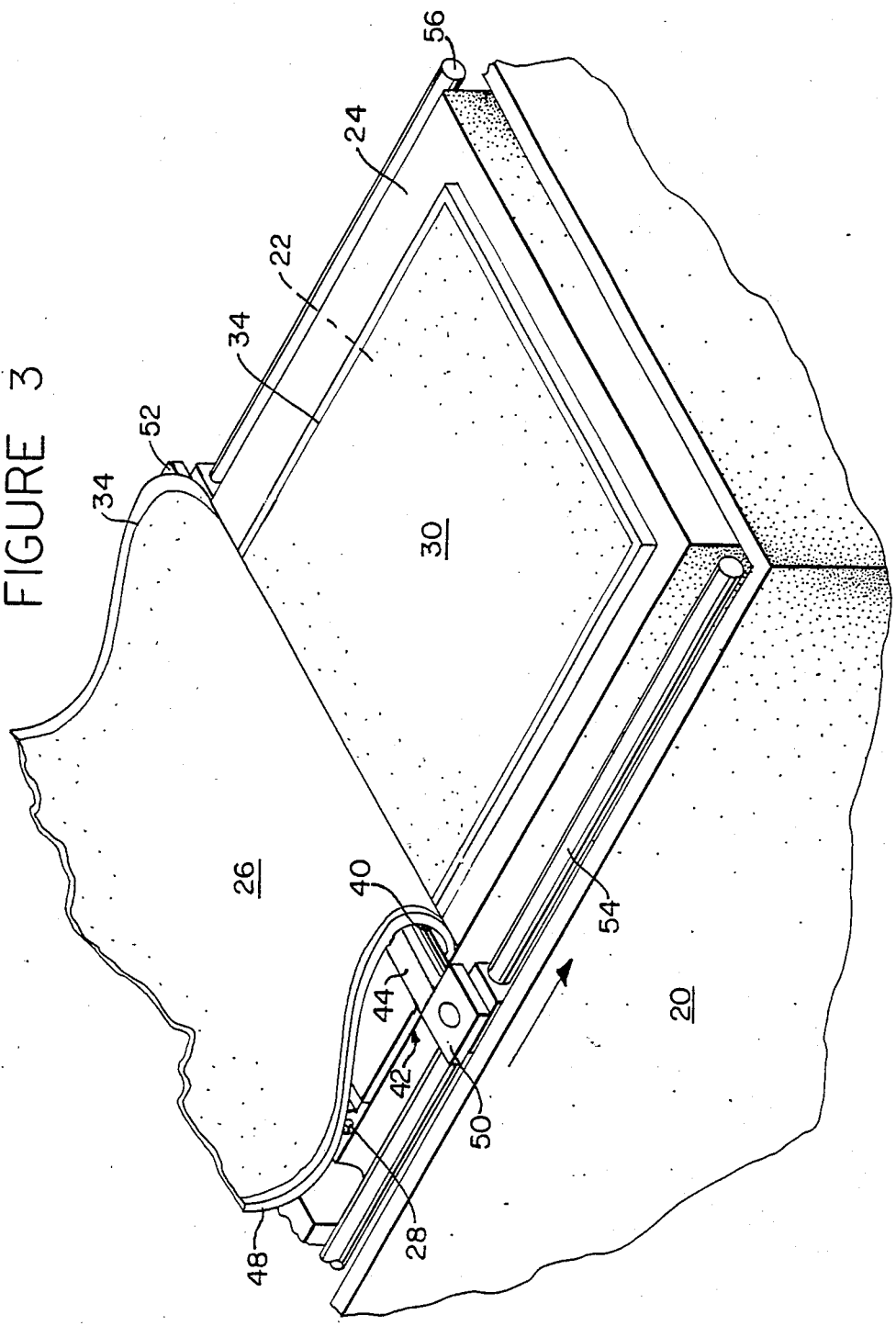
FIG. 3 is an enlarged, fragmentary view in perspective, similar to FIG. 2 but showing the vacuum hold down and roller applying the phototool.

Referring now to FIGS. 1, 2 and 3, the roller 40 and restraining means 42 are mounted on supports 50, 52. The supports 50, 52 are movably mounted on traverse rods 54, 56, respectively, so that as they move along the traverse rods in the direction of the arrow (FIG. 3), the phototool 26 is urged against the PWB 30 by the roller 40. At the same time, the phototool 26 is restrained by the suction force exerted by the restraining means 42 causing the phototool 26 to be urged against the chamber 44. The result is that the phototool 26 is under a slight tension and is gently pulled off the chamber 44 as the roller 40 is advanced.

Consequently, the phototool is laid down wrinkle free, and all air which would otherwise be entrapped between the phototool and the PWB is squeegeed out by the roller. No misalignment occurs because there is no stretching of the phototool in the process of laying it down against the PWB.

After the phototool 26 has been applied to the PWB 30, the supports 50, 52 are retracted and the support plate 22 with the PWB 30 and phototool 26 in place can now be pivoted about shaft 32 for exposure by UV lamps situated within the light box housing 20 immediately below the support plate 22. Alternately, a portable light source can be used to activate the photosensitive polymer. The light box housing 20 can be equipped with a manual switch 58 for energizing the lamps.

Preferably, shaft 32 is restrained so that it can turn only through 180 degrees. The restraining means (not shown) can be a cam rigidly mounted to the shaft 32. As the support assembly ( 22 and 24) rotates through 180 degrees, the cam strikes a stop (not shown) which restrains further motion. A pressure activated light switch (not shown) can be mounted on the stop to automatically activate a light switch to energize the lamps. Similarly, the cam can strike a stop when it is reversed through 180 degrees to its original position. This latter stop can serve to maintain the support plate 22 in a stable position while the phototool 26 is being urged against the PWB 30.

The supports 50, 52 can be moved by a drive means (not shown) which can be a belt or chain drive advanced by a reversible motor.

In another embodiment, the traverse rods 54, 56 can be threaded and the supports 50, 52 are advanced by rotating the traverse rods 54, 56, each traverse rod 54, 56 being threaded into a support 50, 52, respectively.

Figure 4:
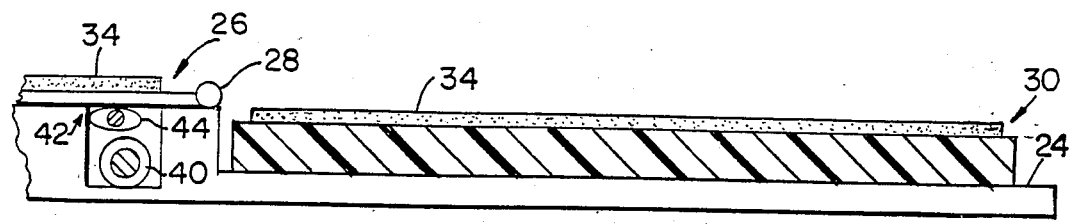
FIGS. 4–7 illustrate schematically a technique for applying a phototool to a substrate and show various stages of that application.
Figure 5:
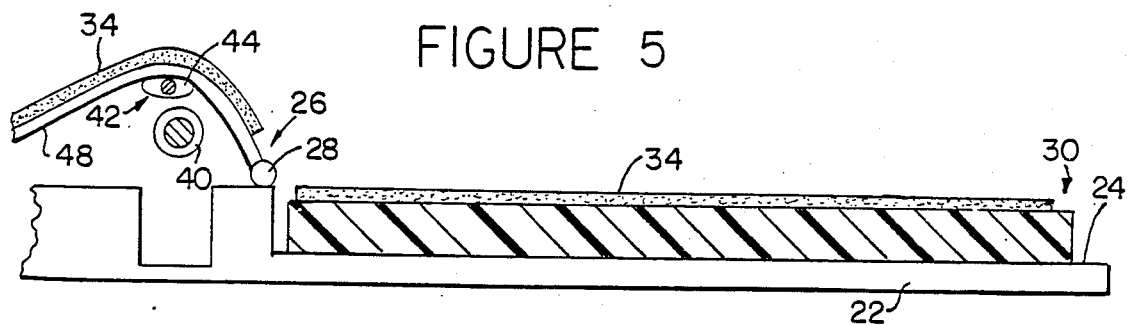
Figure 6:
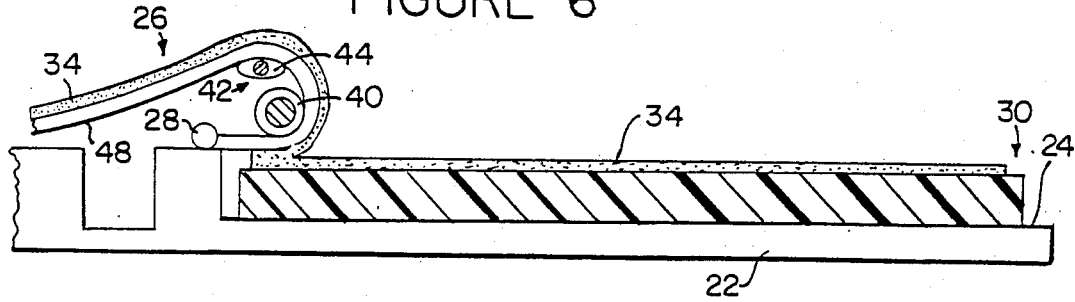
Figure 7:
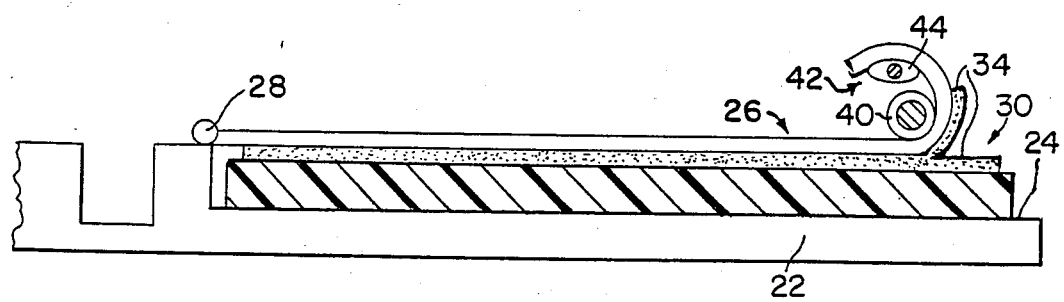
Figure 8:
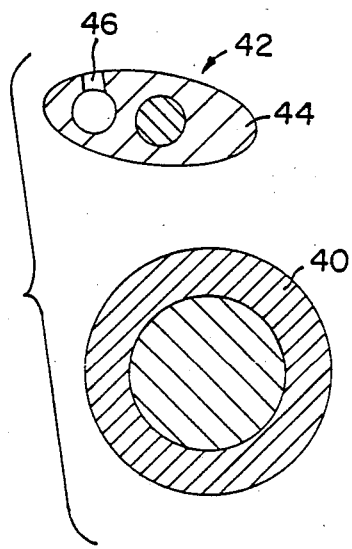
FIG. 8 is an enlarged sectional view of the vacuum hold down and roller apparatus in part.

As shown in FIGS. 4 and 5, roller 40 and restraining means 42 are mounted so as to be capable of being raised and lowered. In the lower position, the phototool 26 can be laid flat against the light box housing 20 for coating with photosensitive polymer 34. The raising and lowering of the roller 40 and restraining means 42 is accomplished by moving the traverse rods 54, 56 and supports 50, 52 as a unit. In the upper position, the roller 40 and restraining means 42 are advanced to apply the phototool 26 to the PWB 30 in a controlled manner as shown in FIGS. 5, 6 and 7.

As used in the specification and claims, the term photopolymer means a polymer which, when exposed to actinic light, will be cured or crosslinked. The term light sensitive receiving element includes a photopolymer coated substrate. The substrate can be a printed circuit board, a printing plate, or other surface upon which an image is to be transferred.

Although a preferred embodiment of the present invention has been shown and described in detail, various modifications and alternative embodiments of the invention will now be apparent to those skilled in the art and such changes are considered to be within the spirit and scope of the invention.

What is claimed is:

1. An apparatus for applying a flexible phototool to a light sensitive receiving element comprising:
    a housing;
    support means for supporting the light sensitive receiving element in the housing;
    securing means for securing one end of the flexible phototool to said housing for registration with said light sensitive receiving element;
    applying means for applying the flexible phototool to the light sensitive receiving element; and
    maintaining means for maintaining the flexible phototool under tension while it is being applied to the light sensitive receiving element, said maintaining means being
    separate from said applying means, and
    positioned adjacent said applying means and between said applying means and a free end of said phototool when said applying means applies the flexible phototool to the light sensitive receiving element.

2. The apparatus of claim 1 wherein the means for maintaining the phototool under tension while the phototool is being applied to the light sensitive receiving element is comprised of vacuum restraining means for maintaining sliding vacuum contact between said maintaining means and said phototool.

3. The apparatus of claim 2 wherein the means for applying the phototool to the light sensitive receiving element is a roller.

4. The apparatus of claim 3 wherein the vacuum restraining means is mounted adjacent the roller, the roller and vacuum restraining means being connected to a support moveably mounted on the housing to guide the roller and vacuum restraining means across the light sensitive receiving element, so that as the roller urges the flexible phototool onto the light sensitive receiving element tension is simultaneously applied to the flexible phototool by means of the vacuum restraining means.

5. The apparatus of claim 4 further comprising means for moving the roller and vacuum restraining means support on the housing.

6. The apparatus of claim 1 wherein the housing includes at least one actinic light lamp spacially oriented beneath the support means, and further comprising means for energizing the lamp.

7. The apparatus of claim 6 wherein the support means is pivotally secured to the housing and the energizing means for the lamp is activated automatically when the support means is pivoted through 180 degrees.

8. The apparatus of claim 1 further comprising means for applying a photopolymer to a substrate on said light sensitive receiving element.

9. The apparatus of claim 1 wherein said securing means includes hinge means for hingedly securing said phototool to said housing.

* * * * *